United States Patent
Costello

(10) Patent No.: US 7,257,004 B2
(45) Date of Patent: Aug. 14, 2007

(54) POWER DELIVERY SYSTEM FOR INTEGRATED CIRCUITS

(75) Inventor: Brian Patrick Costello, Scotts Valley, CA (US)

(73) Assignee: Tyco Electronics Corporation, Middletown, PA (US)

( * ) Notice: Subject to any disclaimer, the term of this patent is extended or adjusted under 35 U.S.C. 154(b) by 457 days.

(21) Appl. No.: 10/840,764

(22) Filed: May 6, 2004

(65) Prior Publication Data

US 2005/0248024 A1    Nov. 10, 2005

(51) Int. Cl.
*H05K 7/20* (2006.01)

(52) U.S. Cl. .................. 361/719; 361/704; 361/803; 174/16.3; 713/330; 439/67; 439/71

(58) Field of Classification Search ........... 361/704, 361/707, 690, 714, 719, 767, 785, 792, 809–811, 361/803, 760–764; 174/250–255, 262–266; 257/727–730, 691, 758; 439/71, 76.1, 76.2, 439/620, 638–639, 485, 487, 924.1; 713/300, 713/310; 29/830–832
See application file for complete search history.

(56) References Cited

U.S. PATENT DOCUMENTS

| | | | |
|---|---|---|---|
| 6,359,783 B1 * | 3/2002 | Noble | 361/704 |
| 6,837,719 B2 * | 1/2005 | Panella | 439/67 |
| 6,847,529 B2 * | 1/2005 | Dibene et al. | 361/803 |
| 6,947,293 B2 * | 9/2005 | DiBene et al. | 361/803 |
| 2002/0162039 A1 * | 10/2002 | Kirker et al. | 713/330 |
| 2003/0198033 A1 | 10/2003 | Panella et al. | 361/760 |
| 2003/0214800 A1 | 11/2003 | Dibene, II et al. | 361/803 |

* cited by examiner

*Primary Examiner*—Michael Datskovskiy

(57) ABSTRACT

A system for delivering power to an integrated circuit (IC) component mounted on a circuit board includes a circuit board having a first side and an opposite second side. An IC component is mounted on the first side of the circuit board, and the IC component has a plurality of power contacts. A voltage regulator module (VRM) is coupled to the second side of the circuit board. The VRM reduces a voltage supplied to the IC component from a first voltage to a second voltage. An interface connector is mounted on the VRM. The interface connector is in mating engagement with the IC component, thereby delivering power at the second voltage directly to the IC component.

16 Claims, 3 Drawing Sheets

POWER DELIVERY SYSTEM FOR INTEGRATED CIRCUITS

BACKGROUND OF THE INVENTION

The invention relates generally to power delivery in electronic circuits and more particularly to power delivery systems for microprocessors and other integrated circuit (IC) devices.

Competition and consumer demand have continued the trends toward faster, higher performance electrical systems, particularly with regard to computer systems. As microprocessors and associated integrated circuits operate at higher speeds, the power requirements for these devices also tend to increase. The speed of the microprocessor is influenced by how fast the microprocessor's internal transistors can switch. Lowering the operating voltage enables faster switching and correspondingly higher speeds. However, as voltage is reduced, operating currents are increased to maintain power. Increasing current can result in more power drain or power losses.

Typically, current microprocessors operate at voltage levels of, for example, 3.3 volts, while future microprocessors are expected to operate at even lower voltages, for instance, voltages approaching 1.5 to 1.0 volts. These low voltages require even greater amounts of current to maintain power. The low voltage requirement of current microprocessors typically requires a localized power converter, such as a DC-to-DC converter, to reduce the voltage supplied to the microprocessor. Typically, the power converter is soldered to a motherboard or plugged into the motherboard via a connector. The lower voltage is then conducted through conductors or printed circuit traces on the motherboard to a connector of the component requiring the lower voltage, such as a microprocessor. Space on the motherboard is at a premium, and locating the power distribution path to the processor on the motherboard takes up space that could be used for other components.

In at least some applications, a power supply interface connector is provided on a top side of the circuit board. For both high speeds and space considerations, it is advantageous to make the interface connector as small as possible and with a very low profile. However, power application can become an issue. As processors become more and more powerful with more and more transistors, power requirements go up dramatically. Typical printed circuit board technologies are encountering at least two problems associated with the interface connectors. One being the ability to carry large amounts of current, and the other, being the ability to maintain a low inductance for signal integrity. With regard to power systems, high current transfer rates, or slew rates, can result in significant power losses if the inductance is too high.

A need exists for a power delivery system that has a high power capacity and low inductance interconnect which overcomes the aforementioned drawbacks while conserving space on the motherboard.

BRIEF DESCRIPTION OF THE INVENTION

In one aspect, a system for delivering power to an integrated circuit (IC) component mounted on a circuit board is provided. The system includes a circuit board having a first side and an opposite second side. An IC component is mounted on the first side of the circuit board, and the IC component has a plurality of power contacts. A voltage regulator module (VRM) is coupled to the second side of the circuit board. The VRM reduces a voltage supplied to the IC component from a first voltage to a second voltage. An interface connector is mounted on the VRM. The interface connector is in mating engagement with the IC component, thereby delivering power at the second voltage directly to the IC component.

Optionally, the system further includes a socket connector mounted on the first side of the circuit board. The IC component is mounted on the socket connector. The circuit board and socket connector each includes a corresponding window. The windows are aligned so that the power contacts are accessible from the second side of the circuit board. The system also includes a heat sink positioned above the IC component. The heat sink is coupled to at least one mounting post on the VRM.

In another aspect, a system for delivering power to an integrated circuit (IC) component mounted on a circuit board is provided that includes a circuit board having a first side and an opposite second side and an IC component mounted on the first side of the circuit board. The IC component has a plurality of power contacts and signal contacts. A voltage regulator module (VRM) is coupled to the second side of the circuit board. The VRM reduces a voltage supplied to the IC component from a first voltage to a second voltage. A first electrical interconnect is in mating engagement with the IC component delivering power directly to the IC component from the VRM, and a second electrical interconnect on the first side of the circuit board delivers signal to the IC component. The first and second interconnects are separate and distinct from one another.

In another aspect, a system is provided for delivering power to an integrated circuit (IC) component mounted on a circuit board. The system includes a circuit board having a first side and an opposite second side, and an IC component mounted on the first side of the circuit board. The IC component has a plurality of power contacts in a core region thereof. A voltage regulator module (VRM) is coupled to the second side of the circuit board. The VRM reduces a voltage supplied to the IC component from a first voltage to a second voltage. An interface connector is mounted on the VRM. The interface connector is in mating engagement with the IC component delivering power at the second voltage directly to the core region of the IC component.

DETAILED DESCRIPTION OF THE INVENTION

Figure 1:
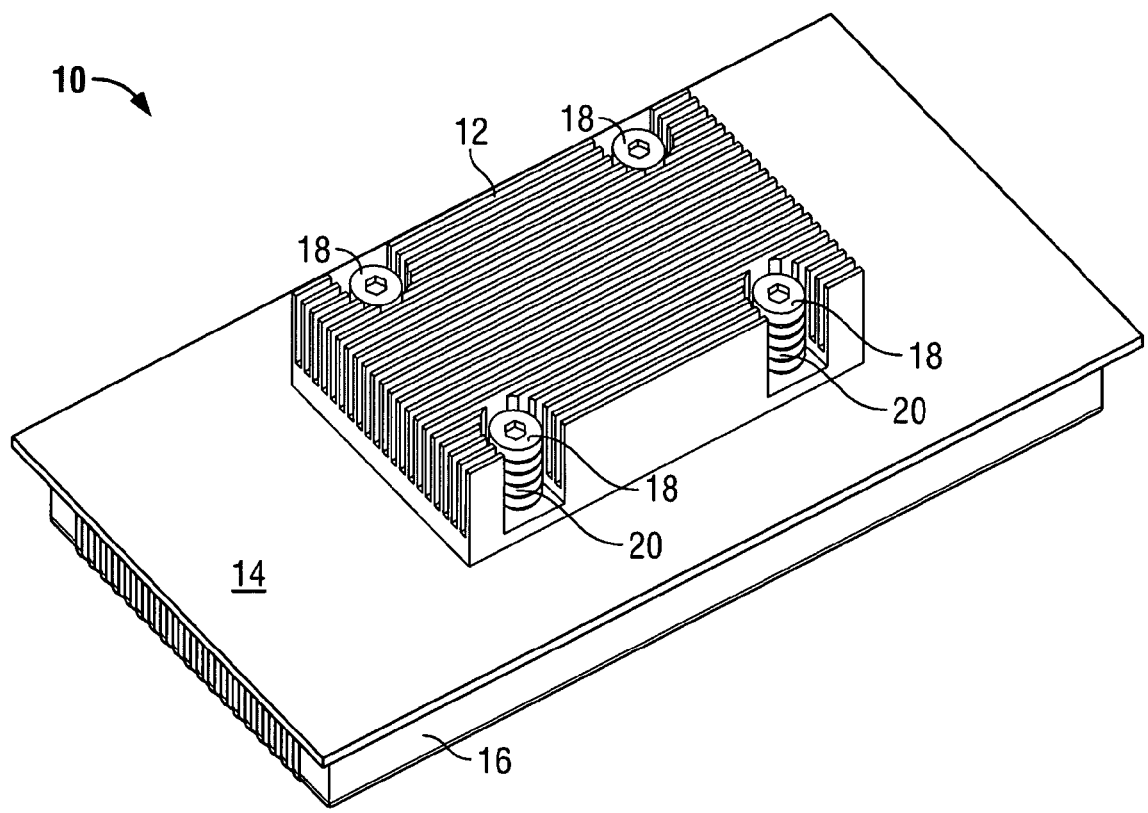
FIG. 1 is a perspective view of a power delivery system formed in accordance with an embodiment of the present invention.

FIG. 1 illustrates a power delivery system 10 in accordance with an embodiment of the present invention. The system 10 delivers power to an integrated circuit (IC) component (shown in FIG. 2). In addition to internal components which will be later described, the system 10 includes a heat sink 12, a circuit board 14 and a voltage regulator module (VRM) 16. The system 10 is held together with fasteners 18 and bias springs 20. In one embodiment, the fasteners 18 may be screws or bolts, or similar fasteners. The system 10 includes a compressive style electrical connector (not shown in FIG. 1). The compressive load is supplied by the springs 20.

It is to be understood that alternative embodiments of the invention may include components not requiring compressive loading in which case the springs 20 my be eliminated. The IC component can be any power consuming device such as, but not limited to, a central processing unit (CPU), microprocessor, or an application specific integrated circuit (ASIC), or the like. While the invention will be described in terms of a land grid array (LGA) IC component, it is to be understood that the following description is for illustrative purposes only and is but one potential application of the inventive concepts herein.

Figure 2:
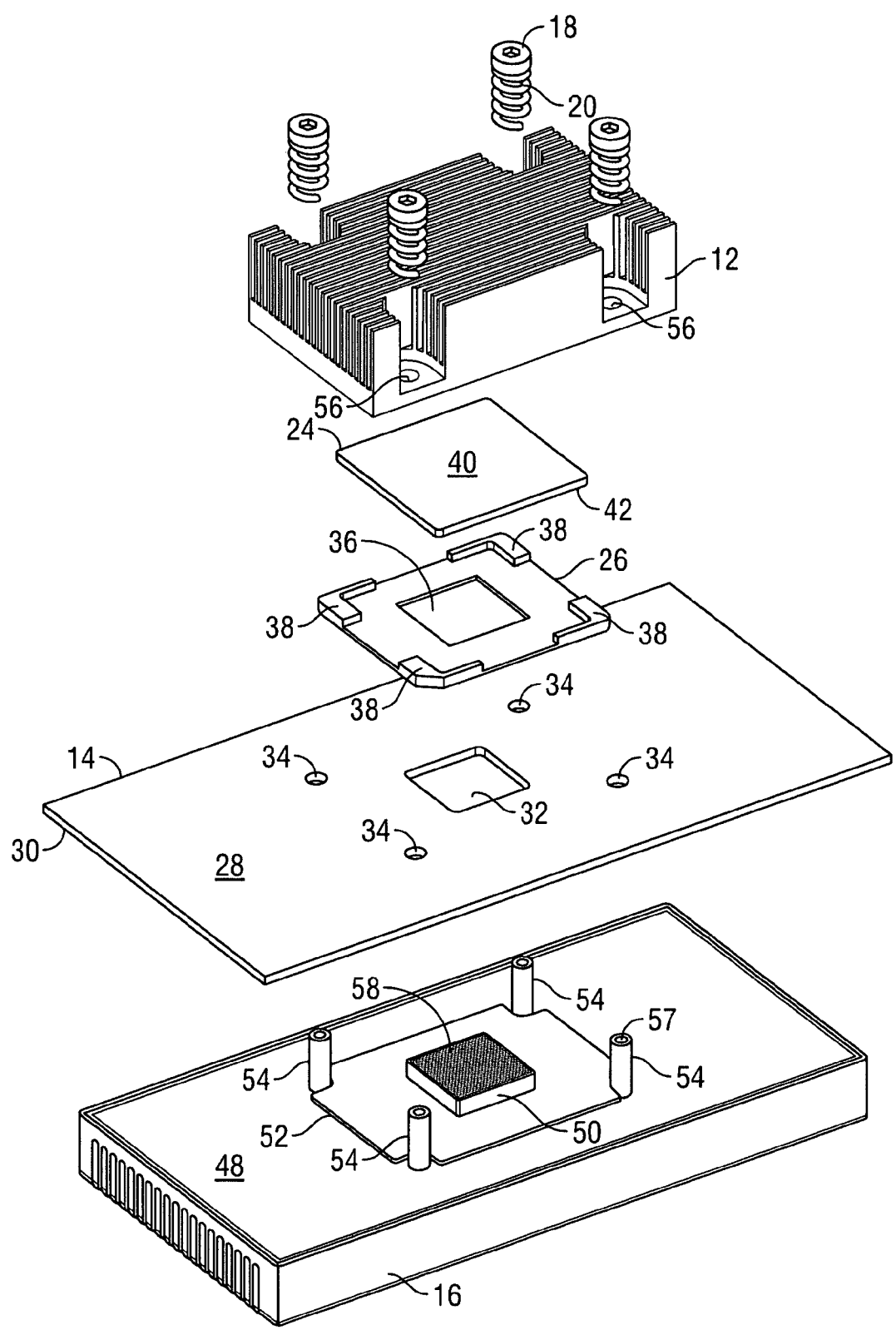
FIG. 2 is an exploded view of the power delivery system shown in FIG. 1.

FIG. 2 illustrates an exploded view of the system 10 illustrating the fasteners 18 and springs 20 with the heat sink 12, an IC component 24, a socket connector 26, the circuit board 14, an interface connector 50, and the VRM 16. The heat sink 12 may also include a fan (not shown) for enhanced cooling of the system 10.

The circuit board 14 has a first or upper side 28 and a second or lower side 30 opposite the upper side 28. The circuit board 14 includes an aperture or window 32 that extends through the circuit board 14 from the first side 28 to the second side 30. Apertures 34 for mounting the heat sink 12 are also provided in the circuit board 14.

The socket connector 26 is mounted to the first or upper side 28 of the circuit board 14. The socket connector 26 also includes a central aperture or window 36 that is aligned with the window 32 of the circuit board 14 when the socket connector 26 is mounted on the circuit board 14. The socket connector 26 includes a plurality of electrical contacts (not shown) arranged around the socket window 36 that are electrically connected to the circuit board 14. In one embodiment, the socket connector 26 is a land grid array (LGA) socket. However, in alternative embodiments, other commonly used connector formats such as a pin grid array (PGA) or ball grid array (BGA) can be used. The socket connector 26 also includes raised corner sections 38 that position and align the IC component 24 in the socket connector 26.

The IC component 24 includes an upper side 40 and a lower side 42 opposite the upper side 40. The lower side 42 includes electrical contacts (see FIGS. 3 and 4) for both power delivery and signal delivery. The power contacts 44 establish a power connection for the power needed to run the IC component 24. Signal contacts 46 (FIG. 4) are arranged around the perimeter of the IC component 24 such that signal is delivered through the socket connector 26. Power contacts 44 (FIG. 4) are positioned in the core or center of the IC component 24.

Figure 3:
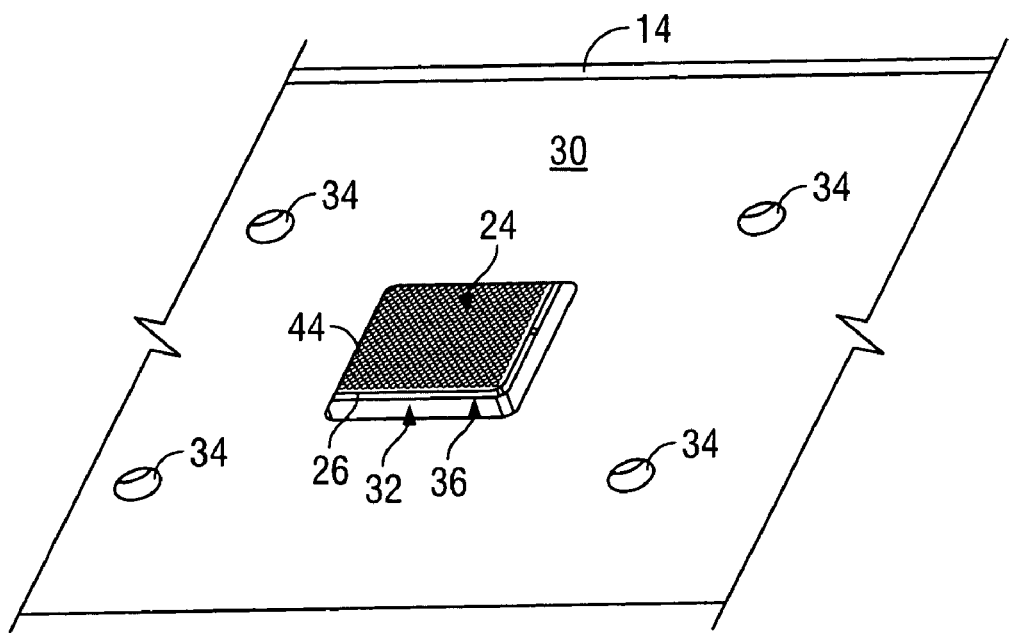
FIG. 3 is a partial perspective view of the lower side of the circuit board shown in FIGS. 1 and 2.

FIG. 3 illustrates a partial perspective view of the second or lower side 30 of the circuit board 14 with the IC component 24 and socket connector 26 mounted on the circuit board 14. The window 36 of the socket connector 26 is aligned with the window 32 in the circuit board 14. With the IC component 24 mounted in the socket connector 26, the power contacts 44 on the IC component core are accessible from the lower side 30 of the circuit board 14. As shown in FIG. 3, the power contacts 44 are arranged as a grid of pads, such as in a land grid array (LGA) configuration. However, any contact design such as a pin grid array or ball grid array or other terminal connectors such as screw lug terminals could be used.

Figure 4:
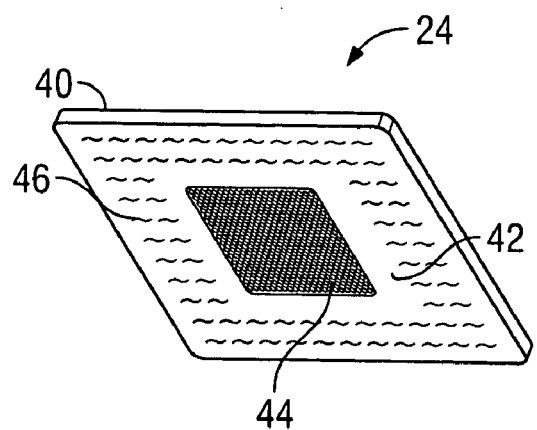
FIG. 4 is a bottom perspective view of the IC component shown in FIG. 2.

FIG. 4 illustrates a perspective view from the lower side 42 of the IC component 24. The power contacts 44 are positioned in the center or core region of the IC component 24. The signal contacts 46 are positioned about the perimeter of the IC component 24 and surround the power contacts 44. In the system 10, power delivery is separate and distinct from signal delivery. Therefore, considerable freedom is provided in the design of the electrical interconnects. In particular, there is no requirement that the power and signal interconnects be of the same format.

Returning to FIG. 2, the VRM 16 has an upper surface 48 that abuts the lower side 30 of the circuit board 14 when the system 10 is assembled. The VRM 16 includes an interface connector 50, a stiffener plate 52 and heat sink mounting posts 54. The heat sink mounting posts 54 extending upward from the upper surface 48 of the VRM 16 and are arranged to align with the apertures 34 in the circuit board 14 and mounting holes 56 in the heat sink 12. When assembled, the mounting posts 54 receive the fasteners 18 into threaded holes 57 to hold the system 10 together. In one embodiment, the springs 20 form a compressive connection between the heat sink 12 and the VRM 16. The stiffener plate 52 is provided to reinforce the circuit board 14 from the compressive load of the springs 20. In alternative embodiments wherein a compressive style power delivery system is not employed, the stiffener plate 52 can be eliminated.

The VRM 16 is provided to supply power to the IC component 24 at a predetermined voltage level. The VRM 16 receives power at a first voltage level that is generally higher than the designed voltage level for the IC component 24, and the VRM 16 provides power to the IC component 24 at a second voltage level required by the IC component 24. For instance, the VRM 16 may take power at a system level, which in some applications may be 12V, and deliver power to the IC component 24 at a voltage level as low as 1-1.5V. The VRM 16 also is designed to deliver power as cleanly as possible, that is, with a minimum of voltage spikes or noise.

The interface connector 50 extends upwardly from the VRM 16 and includes contacts 58 for delivering the regulated electrical power from the VRM 16 to the IC component 24. The contacts 58 are configured to mate with the power contacts 44 (FIG. 3) of the IC component 24. When the system 10 is assembled, the interface connector 50 extends upwardly through the windows 32 and 36 in the circuit board 14 and socket connector 26, respectively, to mate with the power contacts 44 on the IC component 24 to deliver power directly to the core of the IC component 24. Direct delivery of power from the interface connector 50 to the IC component 24 accommodates high levels of power required by today's IC components at low inductance levels.

While the interface contacts 58 are configured to mate with the power contacts 44 on the IC component 24, the electrical connection between the interface connector 50 and the VRM 16 may be established with conventional techniques, such as contact pins extending through contact cavities, surface mount techniques, or optionally by direct solder connections.

In operation, and with reference to FIG. 2, the socket connector 26 is mounted on the circuit board 14 so the window 36 in the socket connector 26 is aligned with the window 32 in the circuit board 14. The IC component 24 is mounted on the socket connector 26 so that the power contacts 44 (FIG. 3) are accessible through the aligned windows 32 and 36 in the circuit board 14 and socket connector 26 respectively. The circuit board 14 is then positioned on the VRM 16 so that the heat sink mounting posts 54 are received in the apertures 34 in the circuit board 14 and the interface connector 50 is received through the windows 32 and 36 to engage the power contacts 44 on the IC component 24.

The heat sink 12 is installed over and in contact with the upper surface 40 of the IC component 24 when the mounting posts 54 are received in the holes 56 in the heat sink 12. The fasteners 18 are received in the mounting posts 54 with springs 20 providing a compressive load between the heat sink 12 and the VRM 16. The springs 20 generate a compressive normal force on the upper surface 40 of the IC component 24 to ensure heat transfer from the IC component 24 to the heat sink 12.

The VRM 16 receives system level power, such as from a power supply (not shown) at a first or system level voltage. The VRM 16 regulates the voltage to a reduced second level required by the IC component 24 and provides the lower voltage to the interface connector 50. The interface connector 50 extends through the windows 32 and 36 in the circuit board 14 and the socket connector 26 to mate with the power contacts 44 on the IC component 24, thereby delivering power directly to the core region of the IC component 24. The interface connector 50 constitutes essentially an entire electrical path from the VRM 16 to the IC component 24. This very short electrical path from the VRM 16 to the IC component 24 delivers power to the IC component 24 at high current with low inductance and low resistance. Signal contacts 46 (FIG. 4) are arranged about the perimeter of the IC component 24. Signals are delivered to the IC component 24 via the socket connector 26 which is electrically connected to the circuit board 14. Thus in the power delivery system 10, the interface connector 50 is a first electrical interconnect that delivers power to the IC component 24. The socket connector 26 is a second electrical interconnect that delivers signals to the IC component 24. The first and second interconnects 50 and 26, respectively, are separate and distinct from one another and are not constrained to using the same electrical interconnection technology. That is, the power contacts in the first interconnect, such as the power contacts 44 and 58 can be an (LGA) format while the signal contacts (not shown) in the second interconnect can have a PGA or BGA or some other format.

The power delivery system 10 therefore provides high levels of power at reduced voltages required by recent high speed IC components such as, but not limited to, microprocessors, ASIC's, and the like while maintaining a low inductance in the power delivery path. The power delivery system 40 includes a circuit board 14 and socket connector 26 that have windows 32, 36 that are aligned so that the power delivery contacts 44 of the IC component 24 are directly accessible from the lower side 30 of the circuit board 14 when the IC component 24 is loaded onto the socket connector 26. A voltage regulator module (VRM) 16 is mounted below the circuit board 14 and includes an interface connector 50 that extends upwardly through the circuit board and socket connector windows 32, 36 to mate directly with the power contacts 44 on the IC component 24 to deliver power to the IC component 24. Direct mating of the interface connector contacts 58 with the power contacts 44 provides for the delivery of high levels of power at low inductance which maintains signal integrity while reducing power losses.

While the invention has been described in terms of various specific embodiments, those skilled in the art will recognize that the invention can be practiced with modification within the spirit and scope of the claims.

What is claimed is:

1. A system for delivering power to an integrated circuit (IC) component, said system comprising:
    a circuit board having a first side and an opposite second side;
    an IC component mounted on said first side of said circuit board, said IC component having a plurality of power contacts;
    a voltage regulator module (VRM) coupled to said second side of said circuit board, said VRM reducing a voltage supplied to said IC component from a first voltage to a second voltage; and
    an interface connector mounted on said VRM, said interface connector in mating engagement with said IC component, thereby delivering power at said second voltage directly to said IC component;
    wherein said circuit board includes a window therethrough, and said interface connector is received in said window to electrically mate with said IC component.

2. The system of claim 1 further comprising a socket connector mounted on said first side of said circuit board, said IC component is mounted on said socket and said socket connector, includes a window aligned with said window of said circuit board so that said power contacts are accessible from said second side of said circuit board.

3. The system of claim 1 further comprising a heat sink positioned above said IC component, said heat sink coupled to at least one mounting post on said VRM.

4. The system of claim 1 further comprising a heat sink positioned above said IC component, said heat sink coupled to at least one mounting post on said VRM, said heat sink including a biasing member configured to apply a compressive load between said heat sink and said VRM.

5. The system of claim 1 further comprising a stiffener plate between said circuit board and said VRM to reinforce said circuit board.

6. A system for delivering power to an integrated circuit (IC) component mounted on a circuit board, said system comprising:
    a circuit board having a first side and an opposite second side;
    an IC component mounted to said first side of said circuit board, said IC component having a plurality of power contacts and signal contacts;
    a voltage regulator module (VRM) coupled to said second side of said circuit board, said VRM reducing a voltage supplied to said IC component from a first voltage to a second voltage;
    a first electrical interconnect in mating engagement with said IC component delivering power directly to said IC component from said VRM; and
    a second electrical interconnect on said first side of said circuit board delivering signal to said IC component, said first and second interconnects being separate and distinct from one another;
    wherein said circuit board includes a window and said first electrical interconnect delivers power to said IC component through said window.

7. The system of claim 6, wherein said second electrical interconnect comprises a socket connector and said IC component is mounted on said socket connector.

8. The system of claim 6, wherein said second electrical interconnect comprises a socket connector, said socket connector including a window that is aligned with said window in said circuit board.

9. The system of claim 6, further comprising a heat sink positioned above said IC component, said heat sink coupled to at least one mounting post on said VRM.

10. The system of claim 6 further comprising a heat sink positioned above said IC component, said heat sink coupled to at least one mounting post on said VRM, said heat sink including fasteners configured to apply a compressive load between said heat sink and said VRM.

11. A system for delivering power to an integrated circuit (IC) component mounted on a circuit board, said system comprising:
- a circuit board having a first side and an opposite second side;
- an IC component mounted on said first side of said circuit board, said IC component having a plurality of power contacts in a core region thereof;
- a voltage regulator module (VRM) coupled to said second side of said circuit board, said VRM reducing a voltage supplied to said IC component from a first voltage to a second voltage; and
- an interface connector mounted on said VRM, said interface connector in mating engagement with said IC component delivering power at said second voltage directly to said core region of said IC component;
- wherein said circuit board includes a window therethrough, and said interface connector is received in said window to electrically mate with said power contacts.

12. The system of claim 11, wherein said IC component further includes a plurality of signal contacts arranged around a perimeter thereof.

13. The system of claim 11 further comprising a socket connector mounted on said first side of said circuit board, said IC component mounted on said socket connector.

14. The system of claim 11, wherein signal is delivered to said IC component through said socket connector.

15. The system of claim 11, further comprising a socket connector mounted on said first side of said circuit board, said IC component is mounted on said socket connector, and said socket connector includes a window aligned with said window of said circuit board so that said power contacts are accessible from said second side of said circuit board.

16. The system of claim 11 further comprising a heat sink positioned above said IC component, said heat sink coupled to at least one mounting post on said VRM.

* * * * *